United States Patent [19]
Nojima

[11] Patent Number: 4,943,783
[45] Date of Patent: Jul. 24, 1990

[54] FEED FORWARD DISTORTION CORRECTION CIRCUIT

[75] Inventor: Toshio Nojima, Yokosuka, Japan

[73] Assignee: Nippon Telegraph and Telephone Corporation, Tokyo, Japan

[21] Appl. No.: 387,256

[22] Filed: Jul. 31, 1989

[51] Int. Cl.⁵ .............................................. H03F 1/32
[52] U.S. Cl. .................................... 330/149; 330/151
[58] Field of Search ................................ 330/149, 151

[56] References Cited
U.S. PATENT DOCUMENTS
4,629,996 12/1986 Watanabe et al. .................. 330/151

*Primary Examiner*—James B. Mullins
*Attorney, Agent, or Firm*—Pollock, Vande Sande and Priddy

[57] ABSTRACT

In a feed forward type distortion correction circuit which detects a nonlinear distortion component of a main amplifier, amplifies the distortion component by an auxiliary amplifier and injects the amplified distortion component into the main amplifier output to cancel the distortion component to thereby reduce the nonlinear distortion component, a predistortion correction circuit is provided at the input side of the main amplifier so as to reduce the distortion component which is produced by the main amplifier, whereby the maximum output of the auxiliary amplifier can be set to a value smaller than the maximum output of the main amplifier.

6 Claims, 7 Drawing Sheets

FEED FORWARD DISTORTION CORRECTION CIRCUIT

BACKGROUND OF THE INVENTION

The present invention relates to a nonlinear distortion correction circuit for suppressing the generation of a nonlinear distortion which is attributable to an incomplete input-output linearity characteristic in an amplifier using a transistor or an electronic tube. More particularly, the invention pertains to a feed forward distortion correction circuit.

As input-output nonlinearity correction means for amplifiers which works well in microwave and other high frequency bands, there has been known a feed forward distortion correction circuit disclosed in U.S. Pat. No. 1,686,792 issued to H. S. Black on Oct. 9, 1928. This correction circuit is referred to also as a feed forward amplifier.

Figure 1:
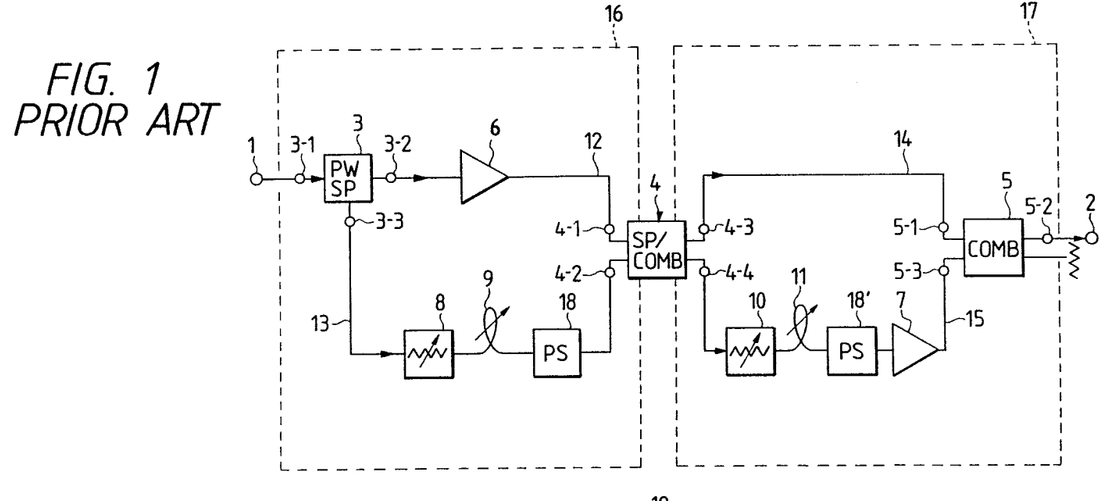
FIG. 1 is a block diagram showing an example of a prior art feed forward type distortion correction circuit.

The conventional feed forward distortion correction circuit is, as depicted in FIG. 1, composed basically of two loops: one is a distortion detecting loop 16 and the other is a distortion removing loop 17.

The distortion detecting loop 16 comprises a signal amplifying path 12, a linear signal path 13, a power splitter 3 for splitting input signal power for delivery to the two paths 12 and 13, and a power splitter/combiner for receiving outputs from the paths 12 and 13 and delivering an amplified signal and a distortion signal. The distortion removing loop 17 comprises a linear signal path 14, a distortion injection path 15, and a power combiner 5 for combining output powers from the two paths 14 and 15. The signal amplifying path 12 includes a main amplifier 6, and the linear signal path 13 includes a variable attenuator 8, a variable delay line 9 and a phase shifter 18. The linear signal path 14 is formed by a transmission line, and the distortion injection path 15 includes a variable attenuator 10, a variable delay line 11, a phase shifter 18' and an auxiliary amplifier 7. The signal amplifying path 12 and the linear signal path 13 of the distortion detecting loop 16 are connected via the power splitter/combiner 4 to the linear signal path 14 and the distortion injection path 15 of the distortion removing loop 17.

Even if one or both of the variable attenuator 8 and the variable delay line 9 are provided in the signal amplifying path 12, it does not make much difference in terms of circuit characteristics. Similarly, one or both of the variable attenuator 10 and the variable delay line 11 may be provided in the linear signal path 14. The phase shifters 18 and 18' each for phase inversion use may also be provided in the paths 12 and 14, respectively. The power splitter 3 is composed of a hybrid circuit. The power splitter/combiner 4 and the power combiner 5 are each formed by a hybrid directional coupler or similar circuit and can be regarded as a simple loss-free linear element.

Now, the operation of the above prior art feed forward amplifier will be described. An input signal applied to an input terminal 1 is applied first to the power splitter 3, wherein it is split into two signals having the same amplitude or an appropriate level difference, and then the signals are provided on the signal amplifying path 12 and the linear signal path 13, respectively. These signals are power-split and combined by the power splitter/combiner 4. The power splitter/combiner 4 is formed by such a directional coupler as that whose transmission losses between ports 4-1 and 4-3 and between ports 4-2 and 4-4 are negligibly small, say, about 0.1 dB, but those between ports 4-1 and 4-4 and between ports 4-2 and 4-3 are as large as 20 dB, for instance.

Figure 2:
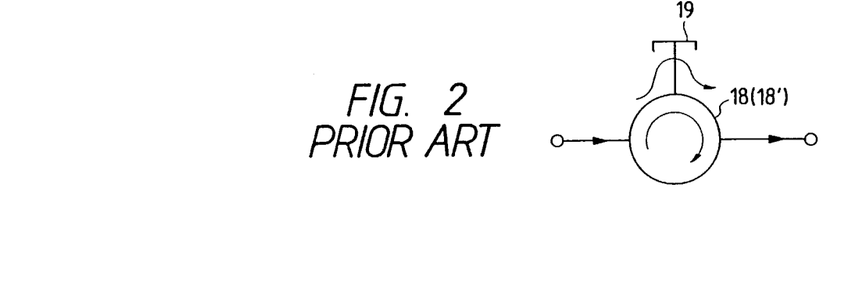
FIG. 2 is a diagram schematically showing an example of a phase shifter formed using a circulator.

The variable attenuator 8 and the variable delay line 9 are adjusted so that the signal component which is applied from the signal amplifying path 12 to the distortion injection path 15 via the power splitter/combiner 4 and the signal component which is applied from the linear signal path 13 to the distortion injection path 15 via the power splitter/combiner 4 are equal in amplitude and delay but opposite in phase. The phase shifter 18 for phase inversion use may be implemented by inserting in the path 12 or 13 a circulator having its one port 19 terminated with a short-circuit as shown in FIG. 2. It is also possible to obtain the required phase inversion function, without providing the phase shifter 18, by suitably setting the phase shift amounts between the input and output ports of the power splitter 3 or power splitter/combiner 4, or forming the main amplifier 6 as a phase inverting amplifier.

Since the distortion detecting loop 16 is constructed as mentioned above, the difference component between the two signal components delivered from the two paths 12 and 13 is detected as the output of the port 4-4 of the power splitter/combiner 4. This difference component is the overall distortion component produced by the main amplifier 6, and loop 16 is called the distortion detecting loop after this function.

The distortion component derived at the port 4-4 of the power splitter/combiner 4 is adjusted in amplitude by the variable attenuator 10, adjusted in delay amount by the variable delay line 11, reversed in phase by the phase shifter 18', and amplified by the auxiliary amplifier 7, thereafter being provided to the power combiner 5. The amplified signal component derived at the port 4-3 of the power splitter/combiner 4 is applied via the linear signal path 14 to a port 5-1 of the power combiner 5. The power combiner 5 is formed by a directional coupler. The transmission loss between the ports 5-1 and 5-2 is negligibly small, say, 0.1 dB, whereas the transmission loss between ports 5-3 and 5-2 was as large as 20 dB, for instance. Accordingly, in order to cancel the distortion component contained in the amplified signal component which is input from the path 14 into the power combiner 5, it is necessary to increase the output of the auxiliary amplifier 7 to such an extent as to compensate for the transmission loss between the ports 5-3 and 5-2.

The variable attenuator 10 and the variable delay line 11 are adjusted so that the signal component having passed through the path 14 from the input port 4-1 of the power splitter/combiner 4 to the output port 5-2 of the power combiner 5 and the signal component having passed through the path 15 are equal in amplitude and delay but opposite in phase. In this instance, since the input signal to the path 15 is a distortion component produced by the main amplifier 6 and detected in the distortion detecting loop 16, the path 15 injects, at the power combiner 5, the distortion component into the output signal of the main amplifier 6 from the path 14 in the opposite phase but with the same amplitude with respect to the distortion component in the signal from the path 14, thus causing the distortion components to cancel each other at the output terminal 2 of the distortion correction circuit. The phase shifter 18' can also be formed by such a circulator as depicted in FIG. 2, but it is also possible to employ an arrangement in which the amounts of phase shift between the input and output ports in the power splitter/combiner 4 or power combiner 5 are set to suitable values, or the auxiliary amplifier 7 is formed as a phase inverting amplifier, instead of using the phase shifter 18'.

The above is an ideal operation of the feed forward amplifier. Summing up its principle of operation, only the distortion component produced by the main amplifier 6 is detected in the distortion detecting loop 16 and is increased in level by the auxiliary amplifier 7, and then, in the distortion removing loop 17, it is reinjected into the main amplifier output in the opposite phase and with the same amplitude to thereby reduce the distortion. This implements an amplifier of excellent linearity.

In this case, it is necessary to minimize the transmission loss during transmission from the output terminal of the main amplifier 6 to the output terminal 2 via the power splitter/combiner 4, the path 14 and the power combiner 5 so as to avoid dropping of the output level of the feed forward amplifier. To meet this requirement, the power splitter/combiner 4 and the power combiner 5 are so constructed as to minimize the transmission loss between the ports 4-1 and 4-3 and the transmission loss between the ports 5-1 and 5-2. Since each of the power splitter/combiner 4 and the power combiner 5 operates as a loss-free circuit in its entirety, it is necessary to minimize the signal power which is delivered from the port 4-1 to 4-4 and the signal power which is delivered from the port 5-3 to 5-2.

This inevitably increases the transmission loss between the ports 4-1 and 4-4 and the transmission loss between the ports 5-3 and 5-2. In order that the transmission losses between the ports 4-1 and 4-3 and between the ports 5-1 and 5-2 may be held within 0.1 dB as mentioned previously, it is necessary that the transmission losses between the ports 4-1 and 4-4 and between 5-3 and 5-2 be larger than 20 dB. Granting that the transmission loss between the ports 4-1 and 4-4 is 20 dB, if the gain of the main amplifier 6 is set to 20 dB, the signal component from the port 4-1 to 4-4 will have a power level substantially comparable to that of the signal component which is input into the port 4-2 from the path 13 and delivered to the port 4-4. On the other hand, since the transmission loss between the ports 5-3 and 5-2 is more than 20 dB, the output signal level of the auxiliary amplifier 7 (which is used as a distortion correction signal) at the port 5-3 must be more than 20 dB above the distortion correction signal level which is needed to cancel the distortion component in the signal which is input into the power combiner 5 from the path 14.

FIGS. 3A, 3B, 3C and 3D show examples of signal spectra which occur at respective circuit points in the feed forward amplifier in the case where two signals of frequencies $f_1$ and $f_2$ and of the same amplitude were applied to the input terminal 1 under the above-mentioned design conditions.

Figure 3A:
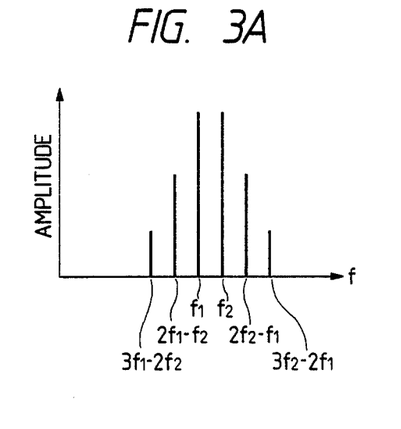
FIGS. 3A through 3D are signal spectrum diagrams for explaining the principle of operation of the feed forward amplifier depicted in FIG. 1.

FIG. 3A shows the output spectrum of the main amplifier 6. Frequency components $f_1$ and $f_2$ are the fundamental wave output components of linearly amplified input signals, $2f_1-f_2$ and $2f_2-f_1$ are third intermodulation distortion components, and $3f_1-2f_2$ and $3f_2-2f_1$ are fifth intermodulation distortion components. Assuming that the output level of the main amplifier 6 is now in the vicinity of a saturated output, the level difference between the fundamental wave output component $f_1$ or $f_2$ and the third intermodulation distortion component $2f_1-f_2$ or $2f_2-f_1$ usually becomes 20 dB or below owing to the nonlinear characteristics of the amplifier. In other words, the level of the third intermodulation distortion component becomes close to the fundamental wave component.

Figure 3B:
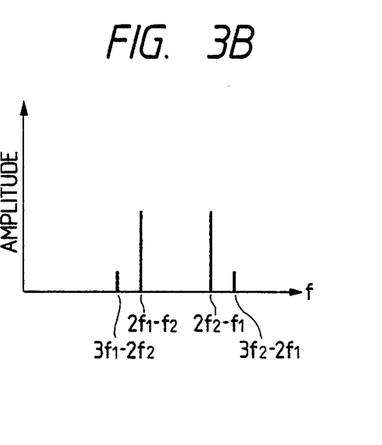

FIG. 3B is the output spectrum of the distortion detecting loop 16, i.e. the output spectrum from the port 4-4, showing the state in which the fundamental wave components are sufficiently suppressed and distortion components are obtained.

Figure 3C:
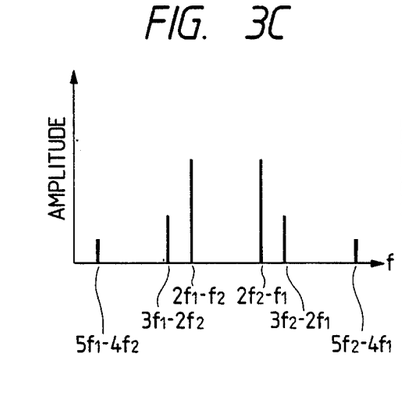

FIG. 3C shows that, for example, in the case where the two third intermodulation distortion components in the output from the port 4-4 are regarded as input fundamental waves to the auxiliary amplifier 7, third intermodulation components $2(2f_1-f_2)-(2f_2-f_1)=5f_1-4f_2$ and $2(2f_2-f_1)-(2f_1-f_2)=5f_2-4f_1$ are newly developed by the auxiliary amplifier 7 in addition to the third intermodulation distortion components $2f_1-f_2$ and $2f_2-f_1$ and the fifth intermodulation distortion components $3f_1-2f_2$ and $3f_2-f_1$ input into the auxiliary amplifier 7.

Figure 3D:
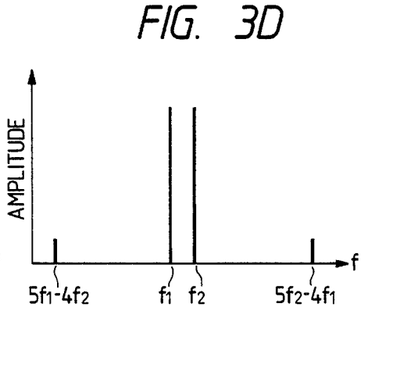

In the power combiner 5 of the distortion removing loop 17 these distortion components $2f_1-f_2$, $2f_2-f_1$, $3f_1-2f_2$ and $3f_2-2f_1$ shown in FIG. 3C are combined with the amplified signal provided from the path 14 thereby cancelling the distortion components depicted in FIG. 3A. In this instance, however, the third intermodulation distortion components $5f_1-4f_2$ and $5f_2-4f_1$ produced by the auxiliary amplifier 7 do not go down in level and remain as distortions of the the feed forward amplifier, as depicted in FIG. 3D. Incidentally, the output level of the auxiliary amplifier 7 (the amplifier distortion correction signal level) must be more than 20 dB above the signal level at the output terminal 2 as referred to previously. This means that if the level difference between the fundamental wave component and the third intermodulation distortion component in the main amplifier output is assumed to be 20 dB, the output level of the auxiliary amplifier 7 must be substantially equal to or higher than the output level of the main amplifier 6.

Accordingly, even if the auxiliary amplifier 7 has a maximum output power nearly equal to that of the main amplifier 6, the level difference between the fundamental wave components $f_1$ and $f_2$ in the output of the feed forward amplifier and the third intermodulation distortion components $5f_1-4f_2$ and $5f_2-4f_1$ attributable to the nonlinearity of the auxiliary amplifier 7 is 40 dB at a maximum, because the level difference between the assumed fundamental wave components $2f_1-f_2$ and $2f_2-f_1$ and the third intermodulation distortion components $5f_1-4f_2$ and $5f_2-4f_1$ in the output of the auxiliary amplifier 7 is also about 20 dB as is the case with the main amplifier 6. The amount of distortion reduction thus achieved by the feed forward arrangement—evaluated in terms of the levels of the residual distortion in the cases where the auxiliary amplifier 7 is operated and is not operated—is only 20 dB at most.

Furthermore, when the maximum saturated output level of the auxiliary amplifier 7 is lower than that of the main amplifier 6, the level of the distortion correction signal from the auxiliary amplifier 7 becomes lower than the level necessary for complete cancellation of the third distortion components in the signal which is supplied from the main amplifier 6 to the power combiner 5 via the path 14, and consequently, the residual third distortion components in the signal which is derived at the output terminal 2 increase accordingly.

While the above has described the operation for correcting the third intermodulation distortion, the operation for the fifth intermodulation distortion is basically the same as described above. In FIG. 3B third intermodulation components which fall in the same frequencies as those of the fundamental waves are not shown for the sake of brevity, but in practice, the distortion components resulting from the nonlinear characteristics of the amplifier include, in addition to the third distortions of the frequency components $2f_1-f_2$ and $2f_2-f_1$, third distortion components of the same frequencies as the fundamental frequencies $f_1$ and $f_2$ which are produced by the main amplifier 6, and these distortion components are also suppressed on the same principle as described above.

As described above, the prior art feed forward amplifier operates as an amplifier of more excellent linearity than in the case of using the main amplifier 6 alone, but it has the defect of necessitating, as the auxiliary amplifier 7, a power amplifier of a maximum output equal to or larger than that of the main amplifier 6 so as to achieve as large an amount of distortion reduction as 20 dB or more at an operating point where the output level is near saturation.

SUMMARY OF THE INVENTION

It is therefore an object of the present invention to provide a feed forward type nonlinear distortion correction circuit which achieves an excellent distortion correction characteristic even if the maximum output level of the auxiliary amplifier used is lower than that of the main amplifier.

According to the present invention, in the feed forward amplifier a predistortion circuit capable of adjusting the amplitude and phase of a nonlinear distortion to be injected is provided in the input signal path of the main amplifier, for reducing in advance the third intermodulation distortion component produced by the main amplifier.

In the conventional feed forward amplifier, since the level of the third distortion produced by the main amplifier is high, the level of the output signal of the auxiliary amplifier (the detected and amplified distortion component of the main amplifier) needs to be raised correspondingly—this leads to the defect of necessitating the use of an auxiliary amplifier of a maximum output substantially equal to that of the main amplifier so as to reduce the residual distortion component and hence heighten the distortion suppressing effect.

In contrast thereto, the present invention affords substantial reduction of the required maximum output of the auxiliary amplifier without lessening the distortion suppressing effect and permits further suppression of distortion in the case of employing an auxiliary amplifier of a maximum output level substantially equal to that of the main amplifier.

DESCRIPTION OF THE PREFERRED EMBODIMENTS

Figure 4:
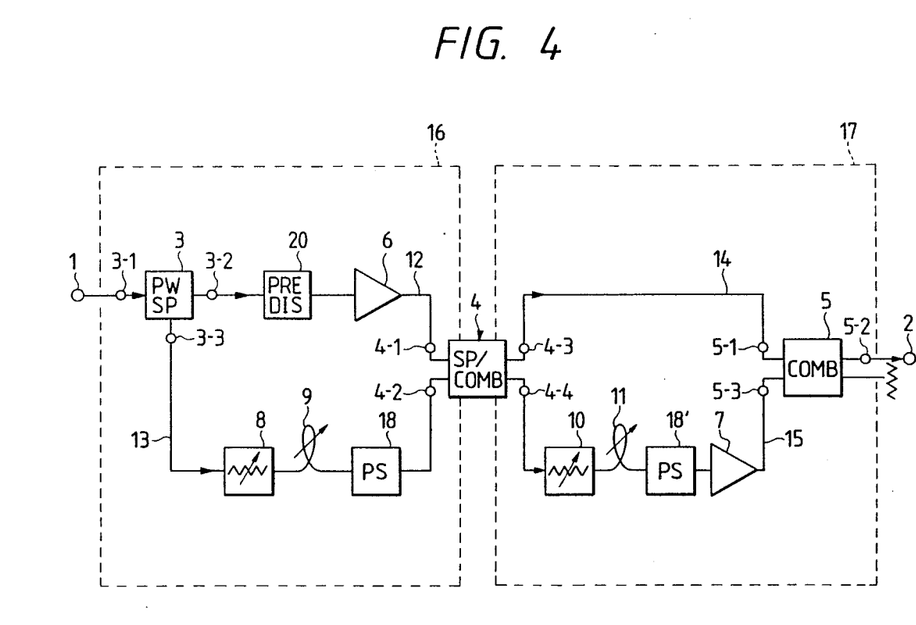
FIG. 4 is a block diagram illustrating a first embodiment of the present invention.

FIG. 4 illustrates in block form a first embodiment of the present invention. In the following description the parts corresponding to those in FIG. 1 are identified by the same reference numerals and their detailed description will not be repeated. The present invention is characterized by the provision of a predistortion circuit 20 that is connected between the input side of the main amplifier 6 and the output port 3-2 of the power splitter 3 in the basic structure of the conventional feed forward amplifier shown in FIG. 1. The variable attenuators 8 and 10 and the variable delay lines 9 and 11 are adjusted in the same manner as described previously in respect of FIG. 1.

Figure 5A:
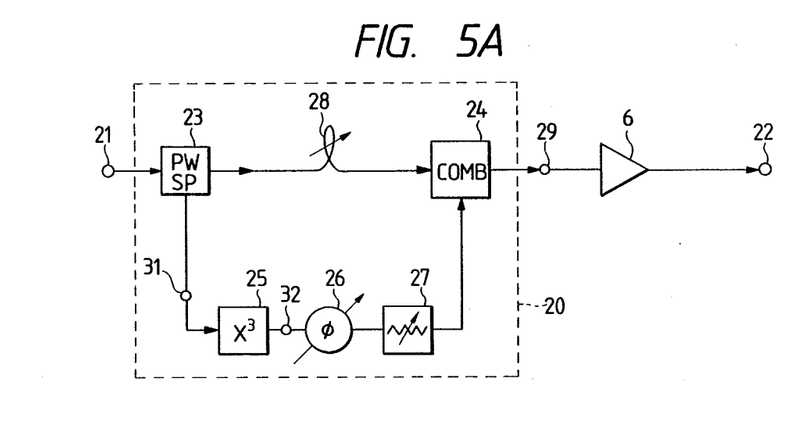
FIG. 5A is a block diagram showing the arrangement of a predistortion circuit for use in the present invention.

The predistortion circuit 20 has a construction such as is shown in FIG. 5A, for instance. The signal supplied from the port 3-2 of the power splitter 3 is applied via an input terminal 21 to the predistortion circuit 20, wherein it is split by a power splitter 23 into two signals of the same amplitude or a suitable level relationship to each other. One of the two split signals is provided on a linear signal path and applied via a variable delay line 28 to a power combiner 24, and the other signal is provided to a third distortion generator 25, wherein a third distortion of the input signal is generated. The third distortion thus produced is adjusted in phase and amplitude by a variable phase shifter 26 and a variable attenuator 27 and is then applied to the power combiner 24, wherein it is linearly combined with the linear signal component supplied thereto via the valiable delay line 28 in appropriate phase and amplitude relationships. The output signal of the predistortion circuit 20 having injected thereinto the third distortion component is provided to the main amplifier 6 of the succeeding stage. Incidentally, the amount of delay by the variable delay line 28 of the signal which is delivered from the power splitter 23 to the power combiner 24 via the delay line 28 is adjusted to be equal to the amount of delay of the signal which is delivered from the power splitter 23 to the power combiner 24 via the third distortion generator 25.

Figure 5B:
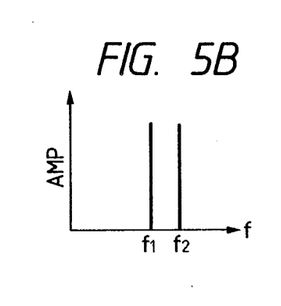
FIGS. 5B and 5C are signal spectrum diagrams for explaining the principle of operation of the predistortion circuit.
Figure 5C:
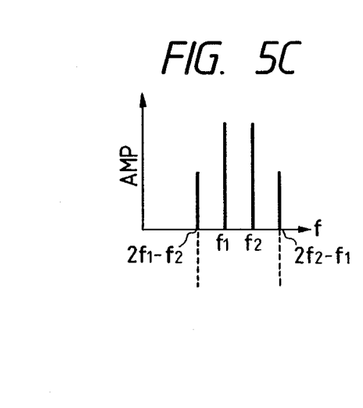

FIG. 5B shows the spectrum of the input signal to the predistortion circuit 20. Assume that signals of the same amplitude and pure frequencies $f_1$ and $f_2$ as shown in FIG. 5B are applied to the predistortion circuit 20. In the output spectrum of the main amplifier 6 there are present the fundamental wave components $f_1$ and $f_2$ of the input signals and third intermodulation distortion components $2f_1-f_2$ and $2f_2-f_1$ produced by the main amplifier 6 as indicated by the solid lines in FIG. 5C and, further, third distortion components of frequencies $2f_1-f_2$ and $2f_2-f_1$ injected by the predistortion circuit 20 as indicated by the broken lines. By preadjusting the variable phase shifter 26 and the variable attenuator 27 of the predistortion circuit 20 so that the two distortion components are equal in amplitude and opposite in phase relative to each other as conceptually depicted in FIG. 5C, it is possible to effect cancellation of the third distortion components in the signal which is provided to an output terminal 22, that is, a distortion-free linear output signal can be obtained.

Figure 6A:
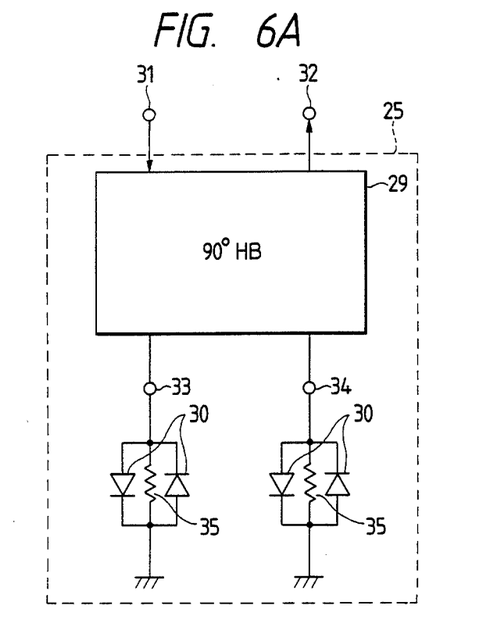
FIG. 6A is a diagram showing an example of a third distortion generator for use in the predistortion circuit.

The third distortion generator 25 can be implemented by such a circuit configuration as shown in FIG. 6A, in which pairs of diodes 30 of anti-parallel connection are connected in parallel to matching resistors 35 with which two equal-amplitude delivery ports 33 and 34 of a 90° hybrid circuit 29 are terminated. The voltage-current characteristic of the paired diodes 30 of anti-parallel connection approximates a cubic curve; accordingly, when a signal is input from input port 31, third distortions develop across the diodes 30 at the ports 33 and 34, respectively in response to a change of the input signal. Due to the property of the 90° hybrid circuit 29 these two third distortion components are 180° out of phase from each other at the input port 31 but in phase at an output port 32, and consequently, the third distortion components are not derived at the port 31 but are derived only at the port 32. Where the input signals equally delivered from the port 31 to the ports 33 and 34 are low in level and stay within the linear operation region of the diodes 30, no reflection occurs at the ports 33 and 34 of the hybrid circuit 20 which are terminated with the matching resistors 35, because the impedance of each diode in the linear operation region is very high as compared with the matching resistance and hence has no influence on the matched impedance. In other words, the overall impedance of the parallel circuit of the diodes 30 and the matching resistor 35 becomes nearly equal to the resistance value of the matching resistor 35, and this is equivalent to the matched termination of the port. In consequence, ideally no linear component is derived from the output port 32. The amount of linear component suppression in the third distortion generator 25 is equal to the amount of isolation between the ports 31 and 32 and can be made more than 30 dB in practice. This permits the generation of third distortion components with a negligibly small linear component.

Figure 6B:
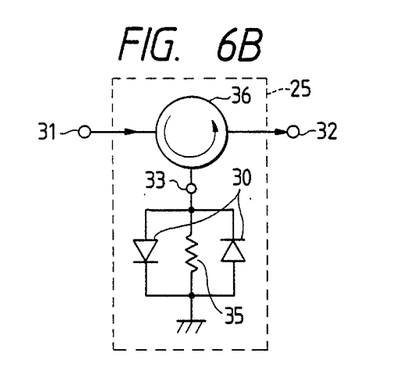
FIG. 6B is a diagram showing another example of the third distortion generator.

FIG. 6B illustrates another example of the third distortion generator 25, in which one port 33 of a 3-port circulator 36 is terminated with the matching resistor 35, and the pair of diodes 30 of anti-parallel connection are connected in parallel to the matching resistor 35. An input signal from the input port 31 is applied to the port 33 where its linear component is terminated, and third distortion components developed across the paired diodes 30 are provided from the port 33 to the port 32.

The principle of operation of the predistortion circuit 25 described above is set forth in detail in T. Nojima and T. Konno, "Cuber Predistortion Linearizer for Relay Equipment in 800 MHz Band Land Mobile Telephone System", IEEE Trans. on Vehicular Tech., vol. VT-34, No. 4, pp169–177, Nov. 1985.

Figure 7A:
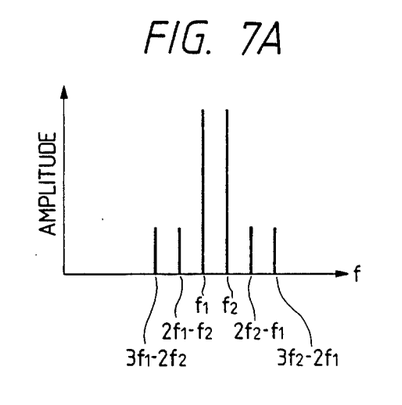
FIGS. 7A through 7D are spectrum diagrams for explaining the principle of operation of the present invention.
Figure 7B:
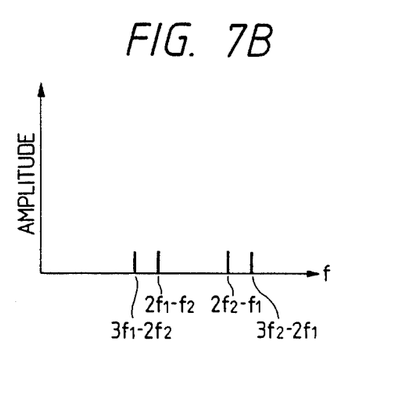
Figure 7C:
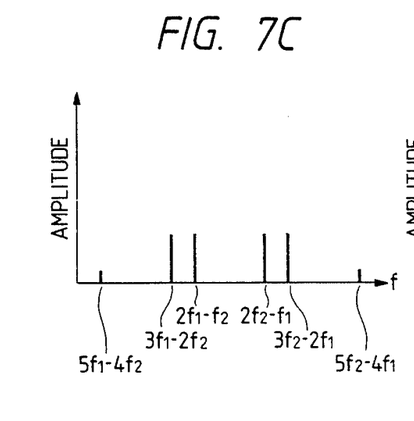

Since the third distortion components in the output of the main amplifier 6 can substantially be reduced by the provision of the predistortion circuit 25 at the input side of the main amplifier 6 as described above, signal spectra which occur at respective principal circuit points of the feed forward amplifier of FIG. 4 at the time of inputting two signals of the same amplitude become as depicted in FIGS. 7A through 7D. FIG. 7A shows the signal spectra at the output of the main amplifier 6. Since the third distortion components $2f_1-f_2$ and $2f_2-f_1$ are significantly reduced as compared with those in the case of the prior art shown in FIG. 3A, the distortion detecting loop output (the output at the port 4-4) also has a spectrum as depicted in FIG. 7B in which the third distortion components are smaller than in FIG. 3B. FIG. 7C shows the output spectrum of the auxiliary amplifier 7 in the case where the signal of the spectrum shown in FIG. 7B was applied. In this case the third intermodulation distortion components $5f_1-4f_2$ and $5f_2-4f_1$ in the case of the two frequency components $2f_1-f_2$ and $2f_2-f_1$ being regarded as input fundamental waves to the auxiliary amplifier 7 are produced in addition to the input signal components of frequencies $2f_1-f_2$, $2f_2-f_1$, $3f_1-2f_2$ and $3f_2-2f_1$, but their levels are negligibly low as described below.

For example, assuming that the auxiliary amplifier 7 has the same characteristic as in the case of FIG. 1 and the amount of third distortion intended to be reduced by predistortion is 10 dB, the third distortion (the components $2f_1-f_2$ and $2f_2-f_1$) level becomes 10 dB lower than in the case of FIG. 3B. Since the level of the third intermodulation distortion by an amplifier is usually in proportion to the cube of the output fundamental wave, the level of the third distortion which is newly produced by the auxiliary amplifier 7 (the third intermodulation distortion components of the frequencies $5f_1-4f_2$ and $5f_2-4f_1$ which are introduced by the auxiliary amplifier 7 in the case where the frequency components $2f_1-f_2$ and $2f_2-f_1$ of the third intermodulation distortions by the main amplifier 6 are used as input fundamental wave signals) in the feed forward amplifier of the present invention becomes 30 dB below the level of the third distortion which is produced by the auxiliary amplifier 7 (the components $5f_1-4f_2$ and $5f_2-4f_1$ shown in FIG. 3B) in the conventional feed forward amplifier depicted in FIG. 1, and consequently, the third distortion newly introduced by the auxiliary amplifier 7 is almost negligible as shown in FIG. 7C. There are also developed third intermodulation distortions in the cases where the detected distortion components of the frequencies $3f_1-2f_2$ and $3f_2-2f_1$, $3f_1-2f_2$ and $2f_1-f_2$, and $3f_2-2f_1$ and $2f_2-f_1$ shown in FIG. 7B are regarded as input fundamental wave signals to the auxiliary amplifier 7, respectively, but their levels are also negligibly low. Other third intermodulation distortion components can easily be removed by a filter, if they are outside the working frequency band of the feed forward amplifier.

Figure 7D:
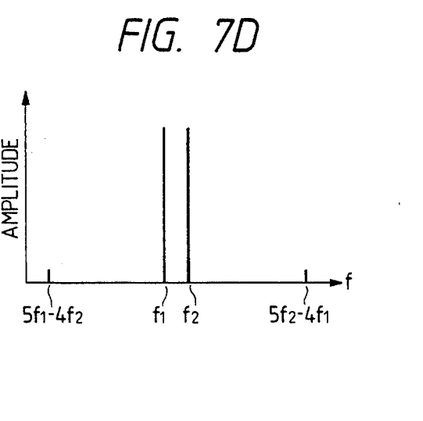

Since the injected distortion components shown in FIG. 7C are removed from the output spectrum of the main amplifier 6 shown in FIG. 7A, the output spectrum of the feed forward amplifier contains only extremely small residual distortion components as depicted in FIG. 7D. In this instance, the maximum output of the auxiliary amplifier 7 was assumed to be equal to that in the structure of FIG. 1; conversely, if the residual distortion level needs only to be about the same as that in FIG. 3D, the auxiliary amplifier output level required in the present invention drops 10 dB, and consequently, the required maximum output level also drops 10 dB.

That is, the required maximum output level of the auxiliary amplifier 7 can be reduced corresponding to the amount of third distortion reduced by predistortion. Assuming that the amount of third distortion reduced by predistortion is 10 dB and the maximum output of the main amplifier 6 is 1 kW as in the above, the required maximum output of the auxiliary amplifier 7, which is 1 kW in the prior art example of FIG. 1, can be reduced down to 100 W according to the present invention.

Figure 8:
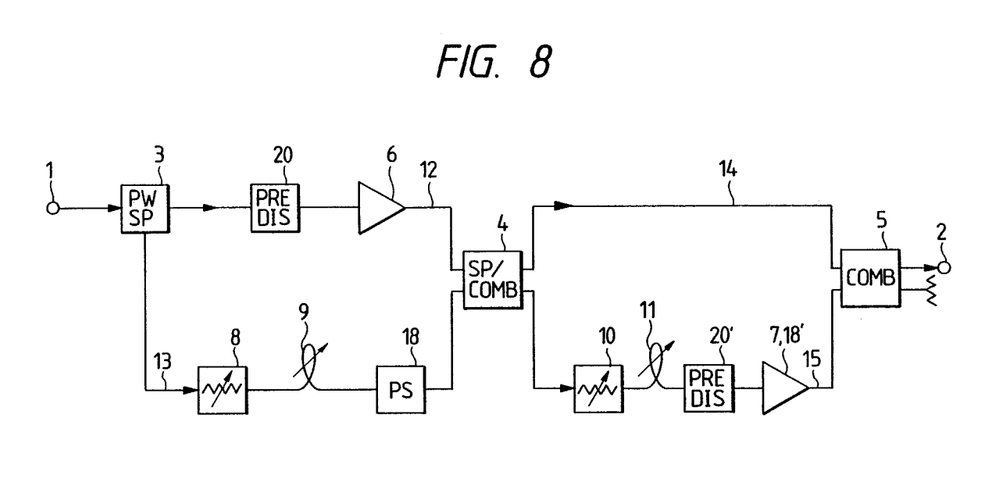
FIG. 8 is a block diagram illustrating a second embodiment of the present invention.

FIG. 8 illustrates in block form a second embodiment of the present invention, in which a predistortion circuit 20' is provided also in the input signal path of the auxiliary amplifier 7. In this embodiment, since the auxiliary amplifier 7 is formed as an inverting amplifier, the phase shifter 18' in the distortion injection path 15 is not provided separately. The predistortion circuit 20' is basically identical in the principle of operation with the predistortion circuit 20 provided in the input signal path of the main amplifier 6. Such an arrangement also affords reduction of the level of the third distortion produced by the auxiliary amplifier 7 and hence permits greater reduction of the residual distortion in the output of the feed forward amplifier than in the first embodiment of the invention described above.

As described above, according to the present invention, nonlinear distortion of a main amplifier of a large output can be decreased by use of an auxiliary amplifier of a far smaller maximum output. Accordingly, the present invention offers an economical and miniature nonlinear distortion correction circuit for correcting nonlinear distortion produced by linear amplifiers in a repeater for coaxial line system and audio equipment as well as by high output amplifiers for transmission in radio telecommunication and radio broadcasting.

It will be apparent that many modifications and variations may be effected without departing from the scope of the novel concepts of the present invention.

What is claimed is:

1. A feed forward type distortion correction circuit comprising
a distortion detecting loop including:
(a) a first power splitting means for splitting an input signal into two signals, and for delivering said two signals to a signal amplifying path and a first linear signal path, respectively;
(b) a main amplifier means in said signal amplifying path for amplifying one of said two split signals;
(c) a predistortion correction means in said signal amplifying path at the input side of said main amplifier means, for reducing the level of a distortion component which is produced by said main amplifier means;
(d) a first level control means in at least one of said signal amplifying path and said first linear signal path, for controlling the level of the signal passing therethrough so that the levels of said two signals are substantially equal in absolute value to each other when they are output from said signal amplifying path and said first linear signal path, respectively;
(e) first phase inverting means in at least one of said signal amplifying path and said first linear signal path, for shifting the phase of the signal passing therethrough so that said two signals are opposite in phase when they are output from said signal amplifying path and said first linear signal path; and
(f) a power splitting/combining means formed by a directional coupler which has first and second ports connected to the outputs of said signal amplifying path and said first linear signal path, respectively, said power splitting/combining means also having third and fourth ports and being operative to combine a signal split from the output of said signal amplifying path and a signal split from the output of said first linear signal path to remove the fundamental wave component of said input signal to detect a distortion component in the output of said main amplifying means and to deliver the detected distortion to said fourth port and to deliver the output of said signal amplifying path to said third port without substantial loss; and said feed forward type distortion correction circuit further having a distortion removing loop including:
(g) a distortion injection path connected to said fourth port of said power splitting/combining means;
(h) a second linear signal path connected to said third port of said power splitting/combining means;
(i) an auxiliary amplifier means in said distortion injection path, for amplifying said detected distortion component;
(j) a second phase inverting means in at least one of said distortion injection path and said second linear signal path, for shifting the phase of one of said amplified distortion component and the distortion component in the signal passing through said second linear path so that the two distortion components are opposite in phase when they are output from said distortion injection path and said second linear signal path, respectively;
(k) second level control means in at least one of said distortion injection path and said second linear signal path, for controlling the level of the signal passing therethrough so that the levels of said two distortion components are substantially equal in absolute value to each other when they are output from said distortion injection path and said second linear signal path, respectively; and
(l) power combining means connected to the outputs of said distortion injection path and said second linear signal path, for combining the signals output from said distortion injection path and said second linear signal path thereby to reduce distortion in the signal output from said power combining means;

said predistortion correction means including:
(m) a second power splitting means for splitting a signal delivered from said first power splitting means into two signals and for delivering them to a third linear signal path and a distortion generating path, respectively;
(n) a distortion generating means provided in said distortion generating path, for generating a distortion component corresponding to said signal delivered from said second power splitting means;
(o) a second power combining means for combining said outputs of said third linear signal path and said distortion generating path and supplying said combined output to said main amplifier means;
(p) a third level control means provided in at least one of said third linear signal path and said distortion generating path; and
(q) a phase shifting means for controlling the phase of the signal passing therethrough so that said distortion component produced by said main amplifier means and said distortion component generated by said distortion generating means are opposite in phase in said second power combining means.

2. The feed forward type distortion correction circuit of claim 1, wherein said predistortion correction means further includes a delay control means in said third linear signal path, for controlling the amount of delay of the signal delivered thereto so that the amounts of delay of said signals from said second power splitting means to said second power combining means via said third linear signal path and via said distortion generating path, respectively, are substantially equal to each other.

3. The feed forward type distortion correction circuit of claim 1, wherein said distortion generating means includes a third distortion generating means for generating a third distortion of said input signal.

4. The feed forward type distortion correction circuit of claim 1, wherein said distortion generating means includes a hybrid circuit which has two terminating ports, an input port connected to the output side of said second power splitting means and an output port connected to the input side of said second power combining means, matching resistors terminating said two terminating ports, respectively, and a pair of diodes of antiparallel connection connected in parallel to each of said matching resistors.

5. The feed forward type distortion correction circuit of claim 4, wherein said hybrid circuit is a 90° hybrid circuit.

6. The feed forward type distortion correction circuit of claim 1, further comprising a second predistortion correction means provided at the input side of said auxiliary amplifier means, for reducing said distortion component which is produced by said auxiliary amplifier means.

* * * * *